(12) United States Patent
Choi

(10) Patent No.: US 8,867,296 B2
(45) Date of Patent: Oct. 21, 2014

(54) REGULATOR, VOLTAGE GENERATOR AND SEMICONDUCTOR MEMORY DEVICE

(71) Applicant: SK hynix Inc., Icheon-si (KR)

(72) Inventor: Sung Wook Choi, Anyang-si (KR)

(73) Assignee: SK Hynix Inc., Gyeonggi-do (KR)

( * ) Notice: Subject to any disclaimer, the term of this patent is extended or adjusted under 35 U.S.C. 154(b) by 53 days.

(21) Appl. No.: 13/844,898

(22) Filed: Mar. 16, 2013

(65) Prior Publication Data

US 2014/0169064 A1    Jun. 19, 2014

(30) Foreign Application Priority Data

Dec. 18, 2012   (KR) .......................... 10-2012-0148378

(51) Int. Cl.
 *G11C 5/14* (2006.01)
 *G11C 13/00* (2006.01)
 *G11C 16/30* (2006.01)

(52) U.S. Cl.
 CPC ............ *G11C 13/0038* (2013.01); *G11C 5/147* (2013.01); *G11C 16/30* (2013.01)
 USPC ...................... 365/226; 365/189.09; 327/540

(58) Field of Classification Search
 CPC ................. G11C 4/147; G11C 16/30; H02M 2001/0058
 USPC ..................... 365/226, 189.09; 327/540, 541; 363/244, 246; 323/282, 284
 See application file for complete search history.

(56) References Cited

U.S. PATENT DOCUMENTS

| | | | | |
|---|---|---|---|---|
| 5,828,892 A | * | 10/1998 | Mizuta | 713/300 |
| 6,300,820 B1 | * | 10/2001 | Fotouhi et al. | 327/536 |
| 7,746,671 B2 | * | 6/2010 | Radecker et al. | 363/21.03 |
| 7,969,754 B2 | * | 6/2011 | Radecker et al. | 363/21.03 |
| 8,564,272 B2 | * | 10/2013 | Yen et al. | 323/288 |
| 2012/0286691 A1 | * | 11/2012 | Jesme | 315/250 |

FOREIGN PATENT DOCUMENTS

KR    1020090090180 A    8/2009

* cited by examiner

*Primary Examiner* — Gene Auduong
(74) *Attorney, Agent, or Firm* — William Park & Associates Patent Ltd.

(57) ABSTRACT

A regulator includes a variable resistance unit coupled between an input node to which a pumping voltage is inputted and a control node and configured to adjust resistance of the variable resistance unit in response to a control signal varied depending on a target voltage, a voltage output unit configured to adjust the pumping voltage according to potential of the control node and output the adjusted pumping voltage, and a regulation unit configured to control the potential of the control node according to the adjusted pumping voltage, to output the target voltage. The regulator adjusts the resistance of an internal resistor according to the target voltage, thereby reducing current consumption.

12 Claims, 4 Drawing Sheets

REGULATOR, VOLTAGE GENERATOR AND SEMICONDUCTOR MEMORY DEVICE

CROSS-REFERENCE TO RELATED APPLICATION

This application claims priority from Korean Patent Application No. 10-2012-0148378, filed on Dec. 18, 2012, the contents of which are incorporated herein by reference in its entirety.

BACKGROUND

1. Technical Field

Embodiments of the present invention generally relate to an electronic device, more particularly relate to a regulator, a voltage generator and a semiconductor memory device.

2. Related Art

A semiconductor memory is divided into a volatile memory device and a non-volatile memory device.

The volatile memory device means a memory device where stored data becomes lost if supplying of a power is stopped, and its writing velocity and reading velocity are rapid. The non-volatile memory device indicates a memory device where stored data remains though a power is not supplied, and its writing velocity and reading velocity are comparatively slow. Accordingly, the non-volatile memory device is used to store data needed to be maintained irrespective of supplying of the power. The non-volatile memory device includes a read only memory ROM, a programmable ROM PROM, an electrically programmable ROM EPROM, an electrically erasable and programmable ROM EEPROM, a flash memory, a phase-change RAM PRAM, a magnetic RAM MRAM, a resistive RAM RRAM, a ferroelectric RAM FRAM, etc. The flash memory device is divided into a NOR type memory device and a NAND type memory device.

A flash memory has an advantage of the RAM programmable and erasable data and an advantage of the ROM for enabling to maintain stored data though supplying of the power is stopped. The flash memory has widely used as a storage medium of portable electronic device such as a digital camera, a personal digital assistant PDA and an MP3 player.

Current consumption of the semiconductor memory device increases due to various causes. The current consumption increases more because a voltage generator of the semiconductor memory device generates high voltage.

SUMMARY OF THE INVENTION

Embodiments of the present invention provide a regulator and a voltage generator for reducing current consumption.

A regulator according to ///an embodiment of the present invention may include a variable resistance unit coupled between an input node to which a pumping voltage is inputted and a control node and configured to adjust resistance of the variable resistance unit in response to a control signal varied depending on a target voltage, a pumping voltage being inputted to the input node, a voltage output unit configured to adjust the pumping voltage according to potential of the control node and output the adjusted pumping voltage, and a regulation unit configured to control the potential of the control node according to the outputted adjusted pumping voltage, to output the target voltage.

The variable resistance unit reduces the resistance according as the target voltage lowers, in response to the control signal.

A voltage generator according to an embodiment of the present invention may include a pump configured to generate a pumping voltage by pumping an external voltage, and a regulator configured to output a target voltage by regulating the pumping voltage. The regulator includes a variable resistance unit coupled between an input node to which a pumping voltage is inputted and a control node and configured to adjust resistance of the variable resistance unit in response to a control signal varied depending on the target voltage, a pumping voltage being inputted to the input node, a voltage output unit configured to adjust the pumping voltage according to potential of the control node and output the adjusted pumping voltage, and a regulation unit configured to control the potential of the control node according to the outputted adjusted pumping voltage, to output the target voltage.

A semiconductor memory device according to an embodiment of the present invention may include a memory array configured to include memory cells coupled to word lines, and a voltage generator configured to generate a voltage supplied to the word lines. The voltage generator includes a pump configured to generate a pumping voltage by pumping an external voltage, and a regulator configured to output a target voltage by regulating the pumping voltage. The regulator includes a variable resistance unit coupled between an input node to which a pumping voltage is inputted and a control node and configured to adjust resistance of the variable resistance unit in response to a control signal varied depending on the target voltage, a pumping voltage being inputted to the input node, a voltage output unit configured to adjust the pumping voltage according to potential of the control node and output the adjusted pumping voltage, and a regulation unit configured to control the potential of the control node according to the outputted adjusted pumping voltage, to output the target voltage.

A regulator and a voltage generator of the present invention adjust internal resistance according to a target voltage, thereby reducing their current consumption.

BRIEF DESCRIPTION OF THE DRAWINGS

The above and other features and advantages of the present invention will become readily apparent by reference to the following detailed description when considered in conjunction with the accompanying drawings wherein.

DETAILED DESCRIPTION

Hereinafter, the preferred embodiments of the present invention will be explained in more detail with reference to the accompanying drawings. Although embodiments have been described with reference to a number of illustrative embodiments thereof, it should be understood that numerous other modifications and embodiments can be devised by those skilled in the art that will fall within the spirit and scope of the principles of this disclosure.

Figure 1:
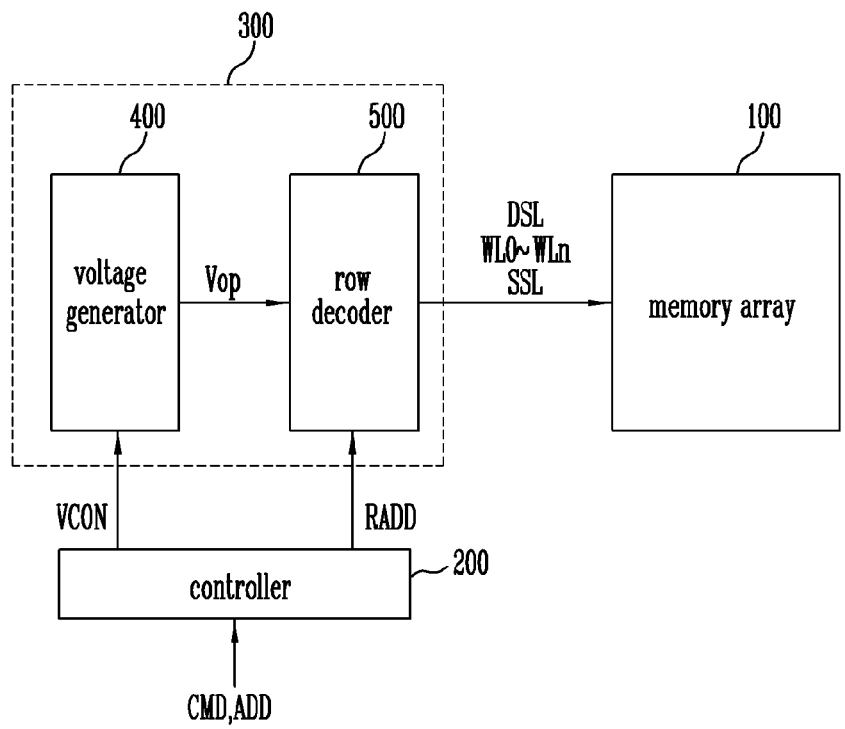
FIG. 1 is a view illustrating circuit of a semiconductor memory device according to an embodiment of the present invention.

FIG. 1 is a view illustrating circuit of a semiconductor memory device according to an embodiment of the present invention.

The semiconductor memory device of the present embodiments may include a memory array 100 having memory cells coupled to word lines, a voltage supplier 300 for supplying an operation voltage to the word lines and a controller 200 for controlling the voltage supplier 300.

The memory array 100 may include memory blocks. Each of the memory blocks may include strings coupled between bit lines and a common source line. That is, the strings are respectively coupled to the bit lines, and are coupled in common to a common source line. Respective strings may include a source select transistor, memory cells and a drain select transistor. A source of the source select transistor is coupled to the common source line, and a drain of the drain select transistor is coupled to the bit line. The memory cells are coupled in series between the select transistors. A gate of the source select transistor is coupled to a source select line, gates of the memory cells are respectively coupled to the word lines, and a gate of the drain select transistor is coupled to a drain select line.

The controller 200 outputs a voltage control signal VCON, for generating operation voltages needed for performing a program operation, a verify operation, a read operation or an erase operation, in response to a command signal CMD inputted from an external device through an input/output circuit. The controller 200 outputs a row address signal RADD in response to an address signal inputted from the external device through the input/output circuit.

The voltage supplier 300 supplies operation voltages Vop, e.g. Verase (erase voltage), Vpgm (program voltage), Vread (read voltage), Vpass (pass voltage), Vvfy (verify voltage), Vdsl (drain select line voltage), Vssl (source select line voltage) and Vcsl (common source line voltage) needed for the program operation, the read operation and the erase operation of the memory cells to local lines of a selected memory block, in response to the voltage control signal VCON of the controller 200. The local lines includes a drain select line DSL, word lines WL0~WLn and a source select line SSL. The voltage supplier 300 may include a voltage generator 400 and a row decoder 500.

The voltage generator 400 outputs the operation voltages Vop needed for operation of the memory cells to global lines in response to the voltage control signal VCON of the controller 200.

The row decoder 500 couples the global lines to the local lines DSL, WL0~WLn and SSL in response to the row address signals RADD of the controller 200, to deliver the operation voltages outputted to the global lines from the voltage generator 400 to the local lines DSL, WL0~WLn and SSL of the selected memory block in the memory array 100.

Figure 2:
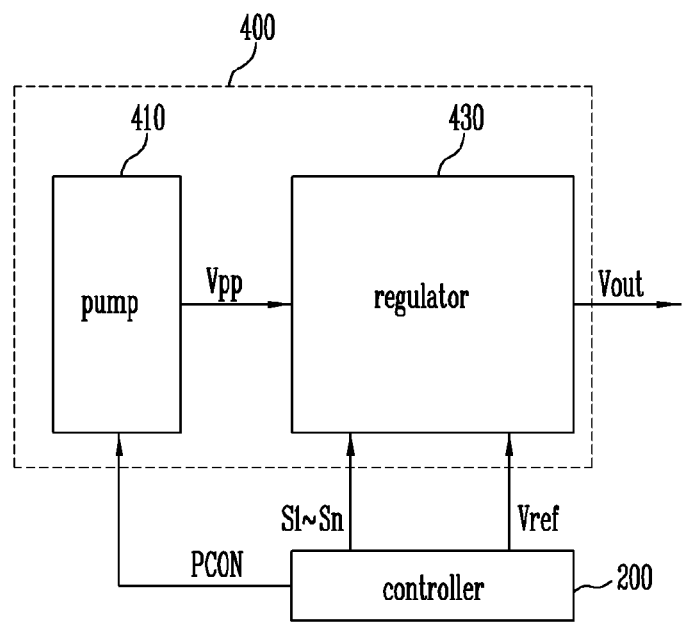
FIG. 2 is a block diagram illustrating the voltage generator in FIG. 1 according to an embodiment of the present invention.

FIG. 2 is a block diagram illustrating the voltage generator in FIG. 1 according to an embodiment of the present invention.

In FIG. 2, the voltage generator 400 of the present embodiments may include a pump 410 and a regulator 430.

The pump 410 generates a pumping voltage Vpp by pumping an external voltage.

The regulator 430 regulates the pumping voltage Vpp, thereby outputting a target voltage.

The controller 200 outputs a control signal PCON for controlling the pump 410. The controller 200 outputs signals S1~Sn for controlling internal resistance of the regulator 430. The controller 200 may include a reference voltage generator (not shown). In an embodiment, the reference voltage generator may be located outside the controller 200, and the controller 200 may control the reference voltage generator to generate a reference voltage.

In an embodiment, the voltage generator 400 may include an integrated circuit (not shown). The integrated circuit may include the controller 200, the voltage generator 400 and a peripheral circuit (not shown). The voltage generator 400 supplies an output voltage Vout to the peripheral circuit. FIG. 2 also illustrates a reference voltage Vref being received by the regulator 430 from the controller 200.

Figure 3:
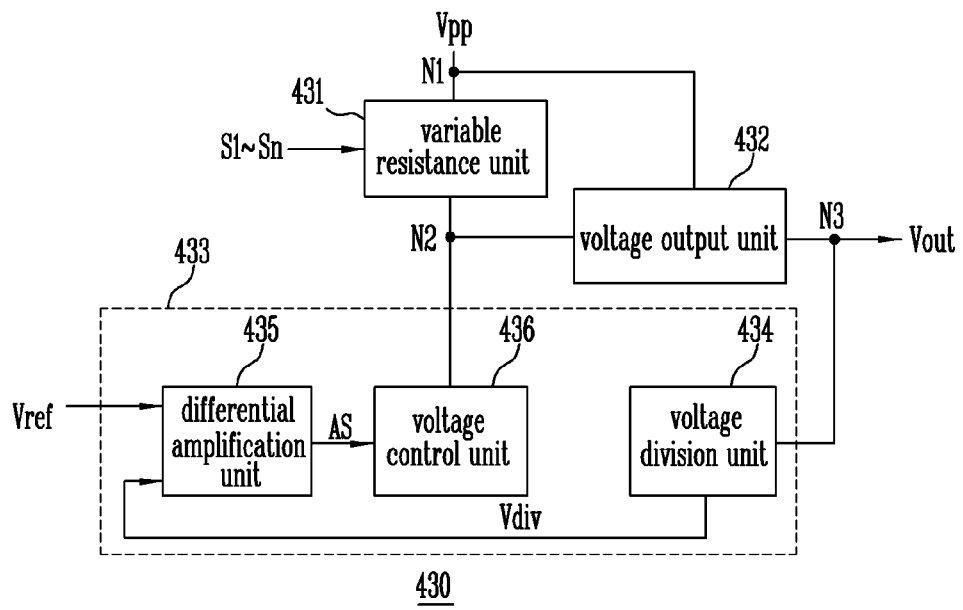
FIG. 3 is a block diagram illustrating the regulator in FIG. 2.

FIG. 3 is a block diagram illustrating the regulator in FIG. 2.

In FIG. 3, the regulator 430 may include a variable resistance unit 431, a voltage output unit 432 and a regulation unit 433.

The variable resistance unit 431 is coupled between an input node N1 and a control node N2 and changes its resistance in response to the control signals S1~Sn varied depending on preset target voltage, the pumping voltage Vpp being inputted to the input node N1. The variable resistance unit 431 reduces the resistance accordingly as the target voltage decreases, in response to the control signals S1~Sn.

The voltage output unit 432 adjusts the pumping voltage Vpp according to potential of the control node N2, and outputs the adjusted pumping voltage Vpp.

The regulation unit 433 controls the potential of the control node N2 according to the output voltage Vout, to output the target voltage.

The regulation unit 433 may include a voltage division unit 434, a differential amplification unit 435 and a voltage control unit 436.

The voltage division unit 434 divides the output voltage Vout, and outputs a division voltage Vdiv in accordance with the dividing result.

The differential amplification unit 435 compares a reference voltage Vref with the division voltage Vdiv, and outputs an amplification signal AS in accordance with the comparing result. Since the regulator 430 is a linear regulator, the amplification signal AS outputted from the differential amplification unit 435 is an analog signal. The amplification signal AS having a higher magnitude is outputted accordingly as a difference between the reference voltage Vref and the division voltage Vdiv increases.

The voltage control unit 436 controls the potential of the control node N2 in response to the amplification signal AS.

Figure 4:
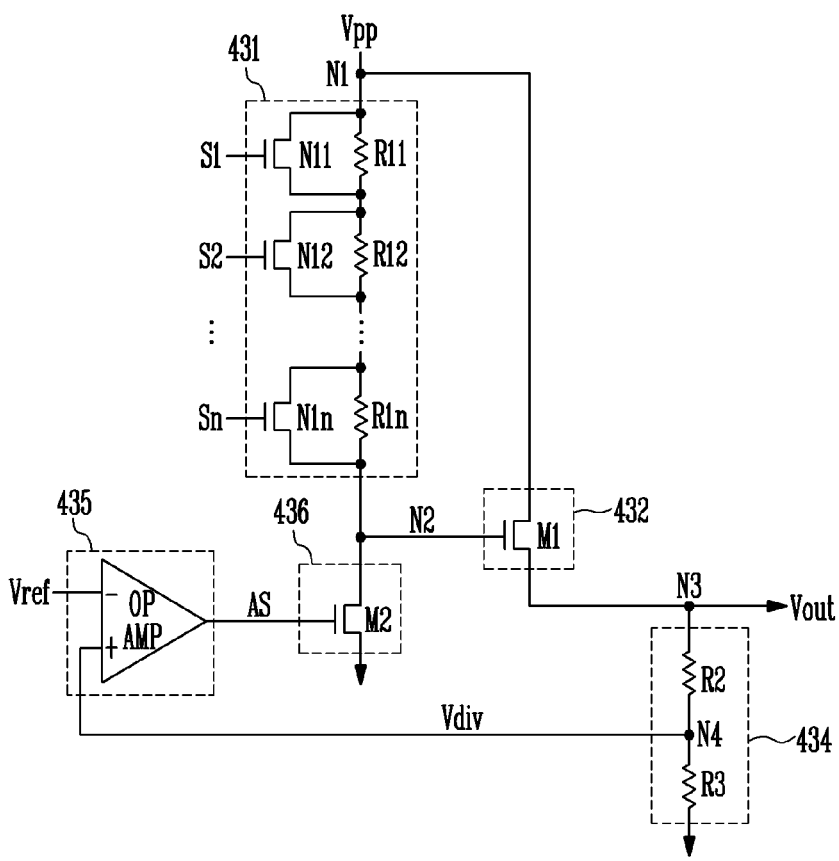
FIG. 4 is a view illustrating circuit of the regulator in FIG. 3 according to an embodiment of the present invention.

FIG. 4 is a view illustrating a circuit of the regulator in FIG. 3 according to an embodiment of the present invention.

In FIG. 4, the variable resistance unit 431 may include resistors R11~R1n (wherein n is a positive integer) coupled in series between the input node N1 and the control node N2 and switching elements N11~N1n coupling both terminals of respective resistors in response to the control signals (i.e., S1~Sn). For example, a first switching element N11 couples both terminals of a resistor R11 in response to a first control signal S1. Accordingly, current does not flow through the resistor R11, but it flows through the first switching element N11.

The variable resistance unit 431 increases the number of the switching elements activated in response to the control signals S1~Sn accordingly as the preset target voltage reduces. The voltage generator of the present embodiments may not include a regulator for first-regulating the pumping voltage outputted from the pump, unlike the conventional voltage generator. The pumping voltage as a high voltage is directly inputted to the regulator, irrespective of the magnitude of the target voltage. A potential difference between the input node N1 and the control node N2 may increase in the event that the magnitude of the target voltage reduces. As a result, current flowing from the input node N1 to the control node N2 increases, and thus current consumption increases. The regulator 431 of the present embodiments increases the number of the switching elements, activated in response to the control signals S1~Sn, accordingly as the target voltage lowers, thereby reducing resistance between the input node N1 and the control node N2. Accordingly, the current flowing from the input node N1 to the control node N2 may reduce.

The voltage output unit 432 may include a first NMOS transistor M1. A drain of the first NMOS transistor M1 is coupled to the input node N1, a gate of the first NMOS transistor M1 is coupled to the control node N2, and a source of the first NMOS transistor M1 is coupled to an output node N3. The first NMOS transistor M1 delivers the pumping voltage Vpp to the output node N3 according to the potential of the control node N2. The voltage output unit 432 outputs a voltage, smaller by threshold voltage Vth of the first NMOS transistor M1 than the potential of the control node N2, to the output node N3 when the pumping voltage Vpp is inputted to the input node N1.

The voltage division unit 434 may include a second resistor R2 and a third resistor R3 coupled in series between the output node N3 and a ground terminal. The voltage of the output node N3 is divided by the second resistor R2 and the third resistor R3, and the voltage division unit 434 outputs the division voltage Vdiv in accordance with the dividing result. The division voltage Vdiv means a voltage of a division node N4.

The differential amplification unit 435 may include an amplifier OPAMP. The reference voltage Vref is inputted to a negative terminal of the amplifier OPAMP, and the division voltage Vdiv is inputted to a positive terminal of the amplifier OPAMP. The amplifier OPAMP amplifies difference between the division voltage Vdiv and the reference voltage Vref, and outputs the amplification signal AS in accordance with the amplification result. The amplification signal AS is an analog signal varied depending on the difference between the division voltage Vdiv and the reference voltage Vref.

The voltage control unit 436 may include a second NMOS transistor M2. The second NMOS transistor M2 controls a potential of the control node N2 in response to the amplification signal AS. The second NMOS transistor M2 operates in a linear region. The second NMOS transistor M2 operates as a static current source. The more magnitude of the amplification signal AS increases, the more current flows through the second NMOS transistor M2. The potential of the control node N2 reduces according as the amplification signal AS increases.

In an embodiment of the present invention, the control signals S11~S1n are inputted to the regulator 430, to reduce resistance of the variable resistance unit 431 accordingly as the magnitude of the target voltage reduces. The potential difference between the input node N1 and the control node N2 reduces accordingly as the target voltage lowers, and thus current flowing through the resistors R11~R1n reduces. As a result, current consumption may reduce. The present invention may not use the regulator in the conventional voltage generator, thereby increasing area efficiency.

Figure 5:
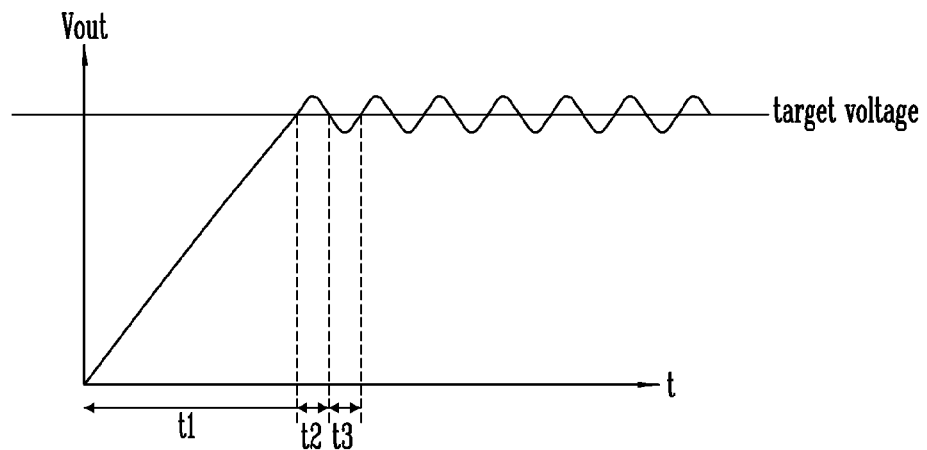
FIG. 5 is a view illustrating a process of outputting the target voltage by using the regulation unit in FIG. 4.

FIG. 5 is a view illustrating a process of outputting the target voltage by using the regulation unit 433 in FIG. 4. The x-axis displaying the interval t (i.e., time).

In FIG. 4 and FIG. 5, the potential Vout of the output node N3 of the regulator 430 is smaller than the target voltage, in an interval of t1. In the event that the voltage output unit 432 outputs the voltage smaller by the threshold voltage Vth of the first NMOS transistor M1 than the potential of the control node N2, the potential Vout of the output node N3 increases. In the event that the division voltage Vdiv of the voltage division unit 434 is inputted to the differential amplification unit 435, the differential amplification unit 435 amplifies the difference between the division voltage Vdiv and the reference voltage Vref. Since the division voltage Vdiv is smaller than the reference voltage Vdiv, the differential amplification unit 435 does not output the amplification signal AS. The control node N2 is not discharged by the voltage control unit 436, and thus the voltage output unit 432 delivers the pumping voltage Vpp to the output node N3, thereby increasing gradually the potential of the output node N3.

In an interval of t2, the potential Vout of the output node N3 is higher than the target voltage. The division voltage Vdiv of the voltage division unit 434 is higher than the reference voltage Vref when the potential of the output node N3 is greater than the target voltage. The differential amplification unit 435 outputs the amplification signal AS having a higher magnitude accordingly as the division voltage Vdiv is higher than the reference voltage Vref. Turn-on of the second NMOS transistor M2 in the voltage control unit 436 increases when the magnitude of the amplification signal AS increases, and so the potential of the control node N2 lowers. Accordingly, the potential Vout of the output node N3 reduces.

In an interval of t3, the potential Vout of the output node N3 increases, operation in the interval of t3 being opposed to that in the interval of t2. The above process is iterated, and the target voltage is outputted in accordance with the iterating. Hence, the voltage generator 400 may output desired target voltage by regulating the pumping voltage Vpp though it does not include the regulator in the conventional technique.

Figure 6:
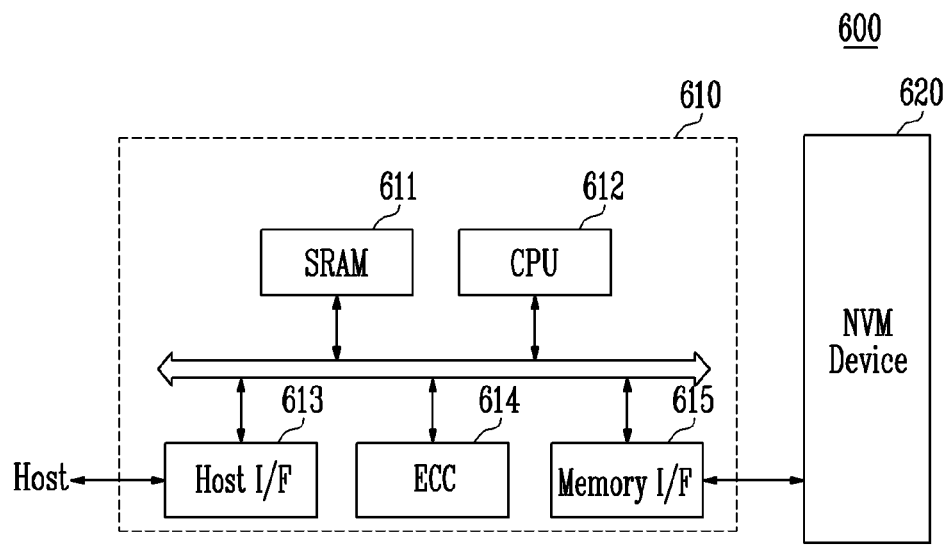
FIG. 6 is a block diagram illustrating schematically a memory system according to an embodiment of the present invention.

FIG. 6 is a block diagram illustrating schematically a memory system according to an embodiment of the present invention.

In FIG. 6, the memory system 600 of the present embodiments may include a non-volatile memory device 620 and a memory controller 610.

The non-volatile memory device 620 may use the semiconductor memory device described above for compatibility with the memory controller 610 and operate using the above method. The memory controller 610 controls the non-volatile memory device 620. The memory system 600 may be used as a memory card or a solid state disk SSD by combination of the non-volatile memory device 620 and the memory controller 610. An SRAM 611 is used as an operation memory of a processing unit 612. A host interface 613 has data exchange protocol of a host accessed to the memory system 600. An error correction block 614 detects and corrects error of data read from the non-volatile memory device 620. A memory interface 615 interfaces with the non-volatile memory device 620 of the present invention. The processing unit 612 performs control operation for data exchange of the memory controller 610.

The memory system 600 of the present invention may further include a ROM (not shown) for storing code data for interfacing with the host and so on. The non-volatile memory device 620 may be provided as multi-chip package including flash memory chips. The memory system 600 of the present invention may be provided as high-reliable storage medium having low error possibility. Specially, the flash memory device of the present invention may be included in the memory system 600 such as the SSD studied actively in recent. In this case, the memory controller 610 communicates with an external device, e.g. host through one of various interface protocols such as USB, MMC, PCI-E, SATA, PATA, SCSI, ESDI, IDE, etc.

Figure 7:
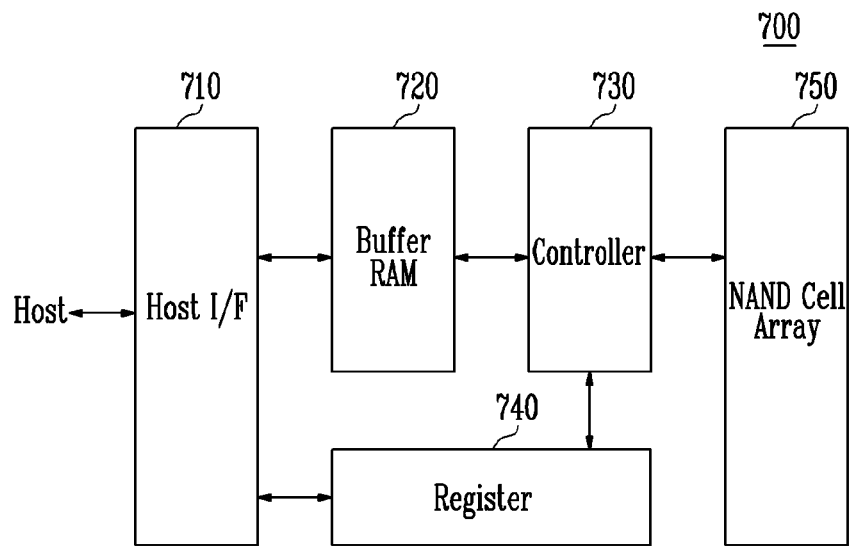
FIG. 7 is a block diagram illustrating schematically a fusion memory device or a fusion memory system for performing a program operation according to the embodiments described above.

FIG. 7 is a block diagram illustrating schematically a fusion memory device or a fusion memory system for performing a program operation according to the embodiments described above. For example, features of the present invention may be applied to an OneNAND flash memory device 700 as a fusion memory device.

The OneNAND flash memory device 700 includes a host interface 710 for exchanging information with a device using different protocol, a buffer RAM 720 for embedding code for driving the memory device or storing temporarily data, a controller 730 for controlling reading, programming and every state in response to a control signal and a command inputted from an external device, a register 740 for storing data such as configuration for defining a command, an address, system operation environment in the memory device, and a NAND flash cell array 750 having an operation circuit including a non-volatile memory cell and a page buffer. The OneNAND flash memory device 700 programs data through the above method in response to write request from the host.

Figure 8:
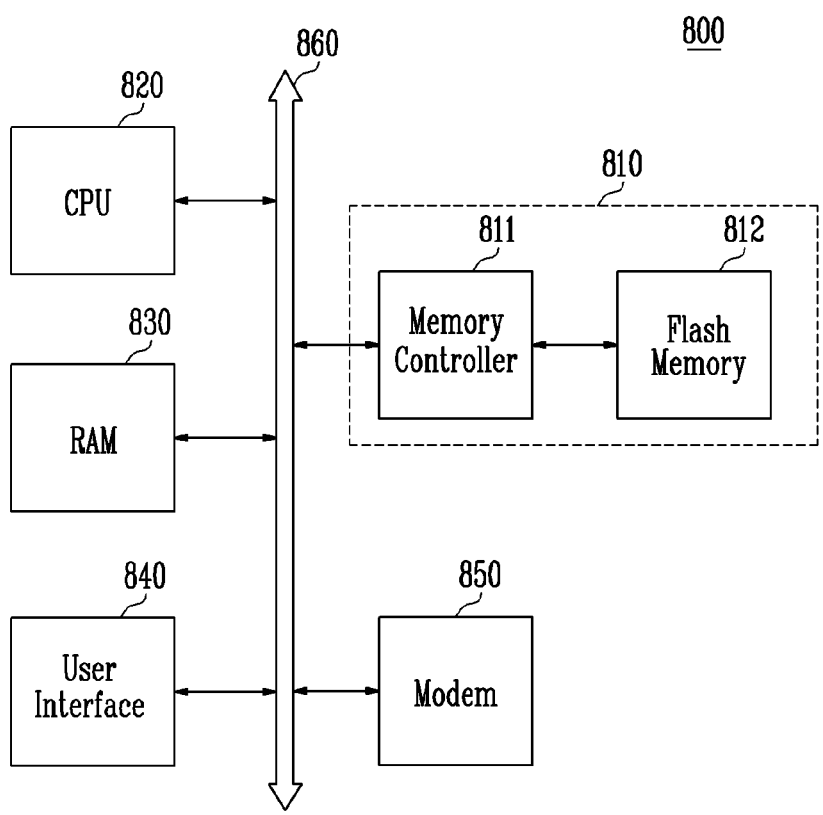
FIG. 8 is a view illustrating schematically a computing system including a flash memory device according to an embodiment of the present invention.

FIG. 8 is a view illustrating schematically a computing system including a flash memory device according to an embodiment of the present invention.

The computing system 800 of the present invention includes a microprocessor or central processing unit 820 connected electrically to a system bus 860, a RAM 830, a user interface 840, a modem 850 such as a baseband chipset and a memory system 810. In the event that the computing system 800 is a mobile device, a battery (not shown) for supplying an operation voltage to the computing system 800 may be further provided. The computing system 800 of the present invention may further include an application chipset, a camera image processor CIS, a mobile DRAM, etc., which are shown. The memory system 810 may include an SSD using for example a non-volatile memory for storing data. The memory system 810 may be applied to a fusion flash memory, e.g. OneNAND flash memory.

The embodiments of the present invention described above can be implemented in the form of program that may be performed using various computer means and can be recorded in a computer-readable medium. The implementation may be easily achieved by a person having ordinary skill in the art.

Although embodiments have been described with reference to a number of illustrative embodiments thereof, it should be understood that numerous other modifications and embodiments can be devised by those skilled in the art that will fall within the spirit and scope of the principles of this disclosure.

What is claimed is:

1. A regulator comprising:
a variable resistance unit coupled between an input node to which a pumping voltage is inputted and a control node and configured to adjust a resistance of the variable resistance unit in response to a control signal varied depending on a target voltage;
a voltage output unit configured to adjust the pumping voltage according to a potential of the control node and output the adjusted pumping voltage; and
a regulation unit configured to control the potential of the control node according to the adjusted pumping voltage, to output the target voltage.

2. The regulator of claim 1, wherein the variable resistance unit reduces the resistance accordingly as the target voltage lowers, in response to the control signal.

3. The regulator of claim 2, wherein the variable resistance unit includes:
resistors coupled in series between the input node and the control node; and
switching elements configured to couple both terminals of respective resistors in response to a corresponding control signal,
wherein the number of activated switching elements increases accordingly as the target voltage reduces.

4. The regulator of claim 1, wherein the regulation unit includes:
a voltage division unit configured to divide the adjusted pumping voltage and output a division voltage in accordance with the dividing result;
a differential amplification unit configured to output an amplification signal by amplifying a difference between a reference voltage and the division voltage; and
a voltage control unit configured to control the potential of the control node in response to the amplification signal.

5. A voltage generator comprising:
a pump configured to generate a pumping voltage by pumping an external voltage; and
a regulator configured to output a target voltage by regulating the pumping voltage,
wherein the regulator includes:
a variable resistance unit coupled between an input node to which a pumping voltage is inputted and a control node and configured to adjust a resistance of the variable resistance unit in response to a control signal varied depending on the target voltage;
a voltage output unit configured to adjust the pumping voltage according to a potential of the control node and output the adjusted pumping voltage; and
a regulation unit configured to control the potential of the control node according to the adjusted pumping voltage, to output the target voltage.

6. The voltage generator of claim 5, wherein the variable resistance unit reduces the resistance accordingly as the target voltage lowers, in response to the control signal.

7. The voltage generator of claim 6, wherein the variable resistance unit includes:
resistors coupled in series between the input node and the control node; and
switching elements configured to couple both terminals of respective resistors in response to a corresponding control signal,
and wherein the number of activated switching elements increases accordingly as the target voltage reduces.

8. The voltage generator of claim 5, wherein the regulation unit includes:
a voltage division unit configured to divide the adjusted pumping voltage and output a division voltage in accordance with the dividing result;
a differential amplification unit configured to output an amplification signal by amplifying a difference between a reference voltage and the division voltage; and
a voltage control unit configured to control the potential of the control node in response to the amplification signal.

9. A semiconductor memory device comprising:
a memory array configured to include memory cells coupled to word lines; and
a voltage generator configured to generate a voltage supplied to the word lines
wherein the voltage generator includes:
a pump configured to generate a pumping voltage by pumping an external voltage; and
a regulator configured to output a target voltage by regulating the pumping voltage,
and wherein the regulator includes:
a variable resistance unit coupled between an input node to which a pumping voltage is inputted and a control node and configured to adjust a resistance of the variable resistance unit in response to a control signal varied depending on the target voltage;
a voltage output unit configured to adjust the pumping voltage according to a potential of the control node and output the adjusted pumping voltage; and
a regulation unit configured to control the potential of the control node according to the adjusted pumping voltage, to output the target voltage.

10. The semiconductor memory device of claim 9, wherein the variable resistance unit reduces the resistance accordingly as the target voltage lowers, in response to the control signal.

11. The semiconductor memory device of claim 10, wherein the variable resistance unit includes:
resistors coupled in series between the input node and the control node; and
switching elements configured to couple both terminals of respective resistors in response to a corresponding control signal,
and wherein the number of activated switching elements increases accordingly as the target voltage reduces.

12. The semiconductor memory device of claim 9, wherein the regulation unit includes:
a voltage division unit configured to divide the adjusted pumping voltage and output a division voltage in accordance with the dividing result;
a differential amplification unit configured to output an amplification signal by amplifying a difference between a reference voltage and the division voltage; and
a voltage control unit configured to control the potential of the control node in response to the amplification signal.

* * * * *